United States Patent
Lee et al.

(10) Patent No.: US 9,799,745 B2
(45) Date of Patent: Oct. 24, 2017

(54) ATOMIC LAYER DEPOSITION METHODS AND STRUCTURES THEREOF

(71) Applicant: Taiwan Semiconductor Manufacturing Co., Ltd., Hsin-Chu (TW)

(72) Inventors: Hsin-Yi Lee, Hsinchu (TW); Cheng-Yen Tsai, New Taipei (TW); Da-Yuan Lee, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/169,566

(22) Filed: May 31, 2016

(65) Prior Publication Data

US 2017/0110551 A1 Apr. 20, 2017

Related U.S. Application Data

(60) Provisional application No. 62/244,084, filed on Oct. 20, 2015.

(51) Int. Cl.
| | |
|---|---|
| *H01L 21/8238* | (2006.01) |
| *H01L 29/49* | (2006.01) |
| *H01L 21/28* | (2006.01) |
| *H01L 27/088* | (2006.01) |
| *H01L 21/67* | (2006.01) |
| *H01L 29/51* | (2006.01) |
| *H01L 21/285* | (2006.01) |
| *H01L 29/78* | (2006.01) |

(52) U.S. Cl.
CPC .... *H01L 29/4966* (2013.01); *H01L 21/28088* (2013.01); *H01L 21/28176* (2013.01); *H01L 21/28556* (2013.01); *H01L 21/67167* (2013.01); *H01L 27/0886* (2013.01); *H01L 29/517* (2013.01); *H01L 29/78* (2013.01)

(58) Field of Classification Search
None
See application file for complete search history.

(56) References Cited

U.S. PATENT DOCUMENTS

| | | | | |
|---|---|---|---|---|
| 2001/0018257 | A1* | 8/2001 | Mathews | H01L 21/32139 438/486 |
| 2013/0273736 | A1* | 10/2013 | Lai | H01L 21/28052 438/653 |
| 2014/0367801 | A1* | 12/2014 | Liu | H01L 29/42376 257/407 |
| 2016/0099181 | A1* | 4/2016 | Tung | H01L 21/823821 257/369 |

* cited by examiner

*Primary Examiner* — Ali Naraghi
(74) *Attorney, Agent, or Firm* — Haynes and Boone, LLP

(57) ABSTRACT

A method and structure for providing a pre-deposition treatment (e.g., of a work-function layer) to accomplish work function tuning. In various embodiments, a gate dielectric layer is formed over a substrate and a work-function metal layer is deposited over the gate dielectric layer. Thereafter, a fluorine-based treatment of the work-function metal layer is performed, where the fluorine-based treatment removes an oxidized layer from a top surface of the work-function metal layer to form a treated work-function metal layer. In some embodiments, after performing the fluorine-based treatment, another metal layer is deposited over the treated work-function metal layer.

20 Claims, 6 Drawing Sheets

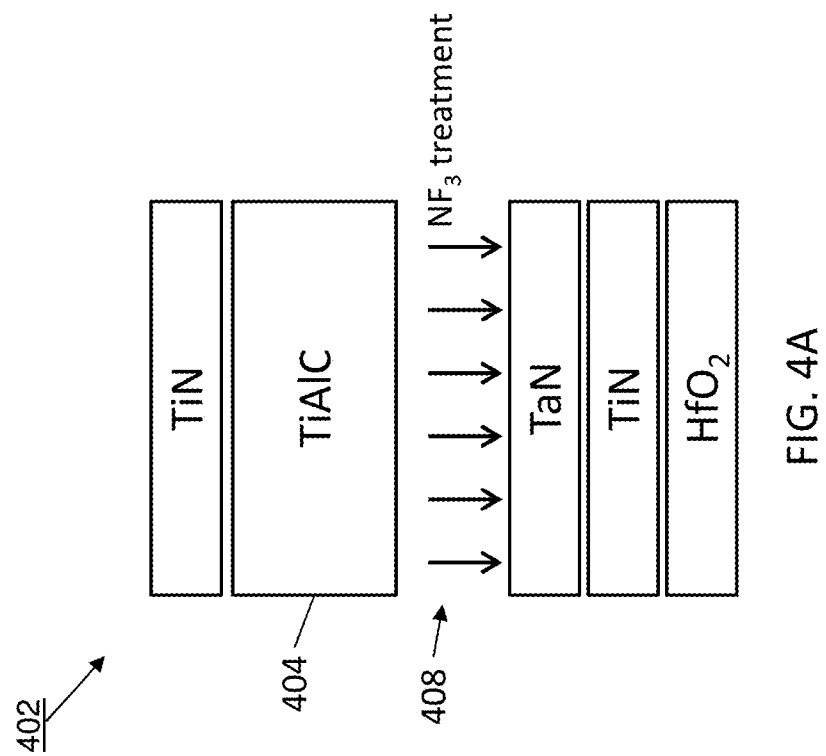

ATOMIC LAYER DEPOSITION METHODS AND STRUCTURES THEREOF

CROSS-REFERENCE TO RELATED APPLICATION

This application claims the benefit of U.S. Provisional Application No. 62/244,084, filed Oct. 20, 2015.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

For example, as metal gate electrodes and high-K gate dielectrics have replaced traditional polysilicon gate electrodes and silicon dioxide dielectrics, one of the key challenges has been to find metal electrode layers having appropriate work function values. To that end, a variety of metal electrode layers, and combinations thereof, having a variety of work function values (e.g., near a conduction band-edge, near a valence band-edge, or near mid-gap) have been investigated for application in a variety of device types (e.g., 2D and/or 3D N-type/P-type FETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A illustrates an exemplary structure of a metal gate stack, in accordance with some embodiments;

FIG. 5 is a schematic top-view diagram of an exemplary multi-chamber processing system, in accordance with some embodiments.

DETAILED DESCRIPTION

Figure 1A:
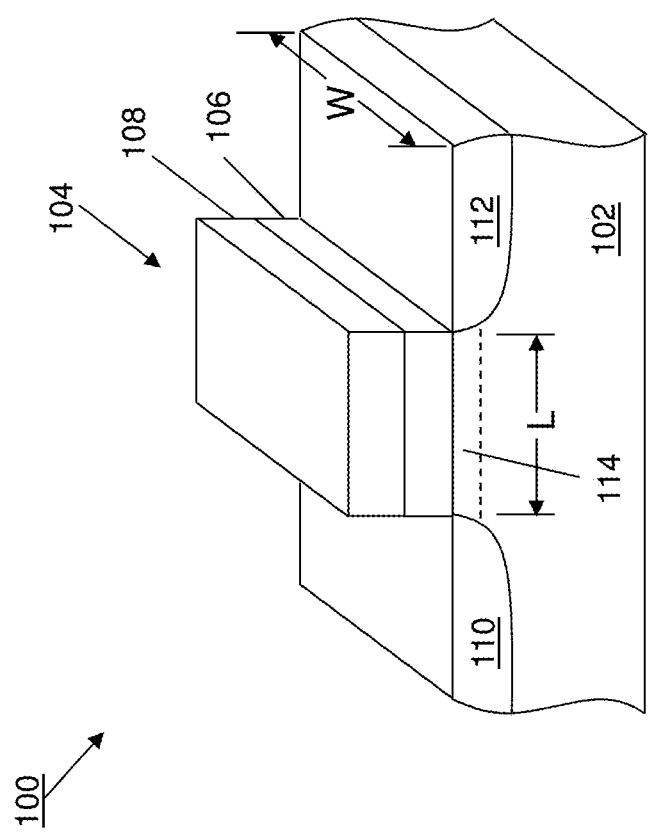
FIG. 1A is a cross-sectional view of an MOS transistor according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of methods of gate stack formation and related gate stack structures, which may be employed in any of a variety of device types. For example, embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (π-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure. For example, some embodiments as described herein may also be applied to the formation of contacts, vias, or interconnects.

With reference to the example of FIG. 1A, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 130. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 106 may include silicon dioxide or other suitable dielectric. The gate dielectric 106 may be formed by ALD, physical vapor deposition (PVD), oxidation, and/or other suitable methods. In some embodiments, the gate electrode 108 may be deposited as part of a gate first or gate last (e.g., replacement gate) process. In various embodiments, the gate electrode 108 includes a conductive layer such as W, TiN, TaN, WN, Re, Ir, Ru, Mo, Al, Cu, Co, Ni, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 104 may provide a gate electrode for the transistor 100, including both N-type and P-type devices. In some embodiments, the gate electrode 108 may alternately or additionally include a polysilicon layer. In various examples, the gate electrode 108 may be formed using PVD, CVD, electron beam (e-beam) evaporation, and/or other suitable process. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown regions, or a combination thereof. The channel region 114 of the transistor 100 is defined as the region between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114. In some examples, the channel region 114 includes silicon (Si) and/or a high-mobility material such as germanium, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2$/V-s and a hole mobility of around 480 $cm^2$/V-s.

Figure 1B:
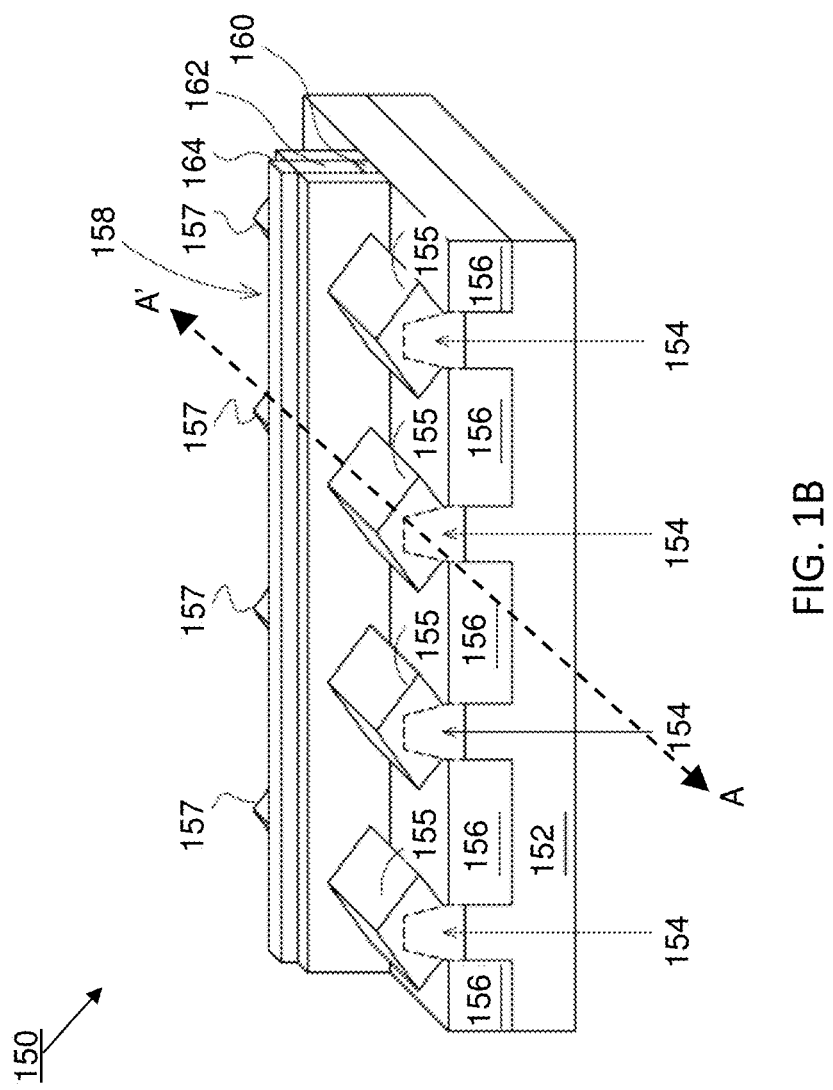
FIG. 1B is perspective view of an embodiment of a FinFET device according to one or more aspects of the present disclosure.

Referring to FIG. 1B, illustrated therein is a FinFET device 150, providing an example of an alternative device type which may include embodiments of the present disclosure. By way of example, the FinFET device 100 includes one or more fin-based, multi-gate field-effect transistors (FETs). The FinFET device 100 includes a substrate 152, at least one fin element 154 extending from the substrate 152, isolation regions 156, and a gate structure 158 disposed on and around the fin-element 154. The substrate 152 may be a semiconductor substrate such as a silicon substrate. In various embodiments, the substrate 152 may be substantially the same as the substrate 102, as described above.

The fin-element 154, like the substrate 152, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 154 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 154. The recesses may be etched using a dry etch (e.g., chemical oxide removal), a wet etch, and/or other suitable processes. Numerous other embodiments of methods to form the fins 154 on the substrate 152 may also be used.

Each of the plurality of fins 154 also include a source region 155 and a drain region 157 where the source/drain regions 155, 157 are formed in, on, and/or surrounding the fin 154. The source/drain regions 155, 157 may be epitaxially grown over the fins 154. In addition, a channel region of a transistor is disposed within the fin 154, underlying the gate structure 158, along a plane substantially parallel to a plane defined by section AA' of FIG. 1B. In some examples, the channel region of the fin includes a high-mobility material, as described above.

The isolation regions 156 may be shallow trench isolation (STI) features. Alternatively, a field oxide, a LOCOS feature, and/or other suitable isolation features may be implemented on and/or within the substrate 152. The isolation regions 156 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 152. The trenches may then be filled with isolating material, followed by a chemical mechanical polishing (CMP) process. However, other embodiments are possible. In some embodiments, the isolation regions 156 may include a multi-layer structure, for example, having one or more liner layers.

The gate structure 158 includes a gate stack having an interfacial layer 160 formed over the channel region of the fin 154, a gate dielectric layer 162 formed over the interfacial layer 160, and a metal layer 164 formed over the gate dielectric layer 162. In various embodiments, the interfacial layer 160 is substantially the same as the interfacial layer described as part of the gate dielectric 106. In some embodiments, the gate dielectric layer 162 is substantially the same as the gate dielectric 106 and may include high-k dielectrics similar to that used for the gate dielectric 106. Similarly, in various embodiments, the metal layer 164 is substantially the same as the gate electrode 108, described above. In some embodiments, sidewall spacers are formed on sidewalls of the gate structure 158. The sidewall spacers may include a dielectric material such as silicon oxide, silicon nitride, silicon carbide, silicon oxynitride, or combinations thereof.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to a pre-deposition treatment (e.g., of a work-function layer) and subsequent atomic layer deposition (ALD) process (e.g., subsequent ALD metal layer deposition), and the structures formed thereby. In some embodiments, the pre-deposition treatment and subsequent ALD process are performed in-situ, as described below. As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also generally be used to refer to processes in which the device or substrate being processed is not exposed to an external ambient (e.g., external to the processing system). In addition, while embodiments of the present disclosure may be primarily discussed with reference to N-type transistors, it will be understood that the embodiments disclosed herein may equally be applied to P-type transistors, where such implementations can be readily deduced by one skilled in the art, for example by symmetry to the N-type device implementations discussed below.

At least some embodiments of the present disclosure are directed to work function tuning for devices manufactured using a 10 nanometer process technology (N10), although it will be understood that embodiments disclosed herein may be equally applied to other process technologies without departing from the scope of the present disclosure. In addition, embodiments of the present disclosure may be simultaneously used to ameliorate gap fill impact (e.g., by use of ALD processing). As used herein, the term "gap fill impact" may be used to describe the challenge of gate metal fill (e.g., in a replacement metal gate process). In some existing processes, poor metal gate deposition may cause gaps or voids in the metal gate, detrimentally impacting device performance. Embodiments of the present disclosure, which advantageously use ALD processing for metal gate layer deposition, provide high-quality, conformal metal gate layers that may be substantially void-free and thereby effectively mitigate potential problems associated with the gap fill impact. Additionally, in at least some existing processes (e.g., some N10 processes), the effective work function is limited by lack of an adequate tuning knob. Thus, there is a need for an effective work function tuning knob to further enhance device performance, for example, that goes beyond the traditional work function tuning approach of layer thickness adjustment. For example, in at least some existing processes (e.g., which employ ALD for gate stack deposition), work function tuning may be achieved by deposition of more ALD cycles to reduce metal surface loading effects.

As described above, embodiments of the present disclosure are directed to a pre-deposition treatment (e.g., of a work-function layer) and subsequent ALD process, and the structures formed thereby. As used herein, the term "pre-deposition treatment" may be used interchangeably with the terms "pre-treatment", "pre-deposition soak", or "pre-soak". Thus, various embodiments disclosed herein are based on cleaning an oxidized surface (e.g., of a work-function layer, upon which an ALD metal film will be subsequently deposited) by using a fluorine [F]-based precursor pre-soak or pre-treatment process. In some embodiments, the [F]-based precursor may include $NF_x$, $TiF_x$, or $WF_x$, where 'x' is equal to about 1-6. In various embodiments, the pre-treatment process is able to clean up oxidation on a surface of a metal film (e.g., an ALD metal film). By using the [F]-based precursor pre-treatment process on a metal film (e.g., on a work-function layer), an oxidation surface of the ALD metal film can be removed, thereby improving threshold voltage (Vt). In some embodiments, the [F]-based precursor pre-treatment is used to treat a surface of a TaN layer within a high-K (HK)/metal gate (MG) stack. In some embodiments, the TaN layer may be the work-function layer described above. In addition, by employing this pre-soak/pre-treatment process, the work function of the subsequently deposited ALD metal film will not depend on a varying substrate surface or quality of an underlying substrate (e.g., such as an underlying work-function layer having an oxidized layer) that can reduce the growth rate (and thus the thickness) of the ALD metal film, thereby helping to improve a device threshold voltage (Vt). Thus, at least some advantages of the present disclosure further include improving device Vt by using a [F]-based precursor pre-soak process to treat a work function setting layer (e.g., N-type work function layer), prior to deposition of an appropriate next metal layer (e.g. another work-function layer, barrier layer, cap layer, or other appropriate next metal layer). In some embodiments, the pre-treatment process and the deposition of the next metal layer may be performed together/sequentially (e.g., in-situ) in a processing system such as a cluster tool (e.g., an ALD cluster tool where chambers are clustered together). To be sure, in some embodiments, a separate ex-situ pre-treatment (e.g., of the work-function layer) followed by deposition of the next metal layer may provide some advantages as well (e.g., threshold voltage improvement).

Figure 2:
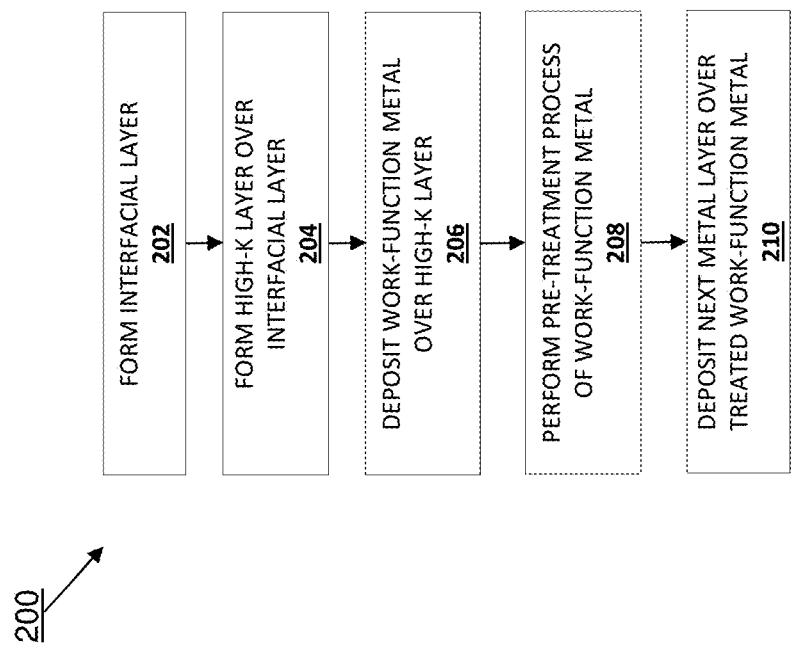
FIG. 2 is a flow chart of a method of performing a pre-deposition treatment of a work-function layer, in accordance with some embodiments.

Referring now to FIG. 2, illustrated is a method 200 of performing a pre-deposition treatment (e.g., of the work-function layer) and subsequent ALD process, in accordance with some embodiments. The method 200 may be implemented on a single-gate planar device, such as the exemplary transistor 100 described above with reference to FIG. 1A, as well as on a multi-gate device, such as the FinFET device 150 described above with reference to FIG. 1B. Thus, one or more aspects discussed above with reference to the transistor 100 and/or the FinFET 150 may also apply to the method 200. To be sure, in various embodiments, the method 200 may be implemented on other devices such as gate-all-around (GAA) devices, Omega-gate (Ω-gate) devices, or Pi-gate (π-gate) devices, as well as strained-semiconductor devices, silicon-on-insulator (SOI) devices, partially-depleted SOI devices, fully-depleted SOI devices, or other devices as known in the art.

It is understood that parts of the method 200 and/or any of the exemplary transistor devices discussed with reference to the method 200 may be fabricated by a well-known complementary metal-oxide-semiconductor (CMOS) technology process flow, and thus some processes are only briefly described herein. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Referring first to the method 200, the method 200 provides a general process flow for performing a pre-deposition treatment (e.g., of the work-function layer) and subsequent ALD process, in accordance with some embodiments. Additional details of the processes and exemplary related structures according to embodiments of the present disclosure are discussed in more detail below with reference to the examples of FIGS. 3A/3B and 4A/4B. The method 200 begins at block 202 where an interfacial layer is formed over the substrate 102, where the formed interfacial layer may be substantially similar to the interfacial layer described above as part of the gate dielectric 106. The method 200 proceeds to block 204 where a high-K dielectric layer is formed on the interfacial layer, where the high-K dielectric layer may be substantially similar to the high-K dielectric layer described above as part of the gate dielectric 106. In some cases, a high-K capping layer may be formed over the high-K dielectric layer.

After formation of the high-K dielectric layer, the method 200 then proceeds to block 206 where a work-function metal is deposited over the high-K dielectric layer. In some embodiments, the work-function metal is part of the gate electrode 108 described above with reference to FIG. 1A. Alternatively, in some embodiments, the work-function metal is part of the metal layer 164 described above with reference to FIG. 1B. As used herein, the term "work-function metal" is used to describe a layer which is used to set a value of the work function of the gate electrode 108. In various embodiments, the work-function metal may include TiN, TaN, TiAlC, TiAl, TiSiN, TaSi, TiAlN, a combination thereof, or other appropriate metal. Thus, in some embodiments, the work-function metal layer deposited over the high-K dielectric layer may include a plurality of layers configured to set the value of the work function of the gate electrode 108. In various examples, the work-function metal may be formed using ALD. By way of example, the work-function metal may be deposited by ALD at a temperature from about 200-600° C. In some cases, the work-function metal may alternately be formed using PVD, CVD, electron beam (e-beam) evaporation, and/or other suitable process. In some embodiments, a surface of the deposited work-function metal (e.g., deposited by ALD) may oxidize (e.g., due to exposure to an external ambient after deposition of the work-function metal), forming an ALD metal oxidation surface on the work-function metal layer.

In at least some existing processes, oxidation of the work-function metal (formation of the ALD metal oxidation surface) may result in a loading effect for a metal layer subsequently deposited on the oxidized work-function metal. As used herein, the term "loading effect" is used to describe an unwanted alteration of characteristics/properties of the metal layer deposited onto the oxidized work-function metal as a result of the oxidized work-function metal. Embodiments of the present disclosure provide for the removal (or substantial removal) of the oxidized layer of the work-function metal prior to the deposition of a subsequent metal layer, thereby preserving the desired characteristics/properties of the subsequently deposited metal layer.

The method 200 then proceeds to block 208 where a pre-treatment process of the work-function metal is performed. In an embodiment of the block 208, the ALD metal oxidation surface (e.g., the oxidized layer of the work-function metal) may be removed by a pre-treatment process that includes a F-based precursor to treat the ALD metal oxidation surface before depositing a subsequent metal film over the work-function metal. In some embodiments, the F-based precursor includes $NF_x$, $TiF_x$, or $WF_x$, where 'x' is equal to about 1-6. In various embodiments, the pre-treatment process, and the metal film deposition which follows, is an in-situ process, for example, performed within a processing system such as an ALD cluster tool.

In various embodiments, the pre-treatment process may be performed via a plasma generated using the F-based precursor or via a thermal chemical reaction employing the F-based precursor. For embodiments employing a plasma treatment, by way of example, the F-based precursor may be introduced into a processing chamber of the processing system (e.g., where the processing chamber houses the substrate having the ALD metal oxidation surface) at a pre-treatment processing temperature of 20-200° C., and at a flow rate of about 5-500 standard cubic centimeters per minute (sccm). In some embodiments, the plasma may be generated at a power of about 10-1000 Watts (e.g., using a DC or RF power supply). For embodiments employing a thermal chemical reaction treatment, by way of example, the F-based precursor may be introduced into the processing chamber of the processing system at a pre-treatment processing temperature of about 100-1000° C. In some examples, a flow rate of about 100-8000 sccm may be used for embodiments employing the thermal chemical reaction. In various examples, the pre-treatment processing conditions (e.g., including selection of the F-based precursor, pre-treatment temperature, flow rate of the F-based precursor, and power (e.g., for embodiments employing plasma generation)) are selected so as to induce a reaction between the F-based precursor and the ALD metal oxidation surface, such that as a result of the pre-treatment process, the oxidized layer of the work-function metal is removed or cleaned off, thereby leaving behind an non-oxidized, clean work-function metal surface. To be sure, in some embodiments, a separate ex-situ pre-treatment (e.g., of the work-function layer) followed by deposition of the next metal layer may provide some advantages as well (e.g., threshold voltage improvement).

After the pre-treatment process, the method 200 then proceeds to block 210 where a next (subsequent) metal layer is deposited over the pre-treated work-function metal. In some embodiments, the next metal layer may include an N-metal layer (e.g., such as TiAlC) and a TiN layer over the N-metal layer, and in some examples the next metal layer may be deposited by ALD. By way of example, and in some embodiments, the next metal layer may also be part of the gate electrode 108 described above with reference to FIG. 1A. Alternatively, in some embodiments, the next metal layer may also be part of the metal layer 164 described above with reference to FIG. 1B. Additionally, in some embodiments, the next metal layer(s) deposited over the pre-treated work-function layer may include one or more other layers (e.g., in addition those described above). In some cases, the next metal layer(s) and any other layers deposited over the pre-treated work-function layer may also be used to set the value of the work function of the gate electrode 108. Of particular note, since the oxidized layer of the work-function metal was cleaned/removed during the pre-treatment process, as described above, the next metal layer may be deposited onto the non-oxidized, clean work-function metal surface. As such, the desired characteristics/properties of the deposited next metal layer are preserved, as the next metal layer is not subject to loading effects (e.g., due to an oxidized layer) of the underlying work-function metal. As a further result, embodiments of the present disclosure result in devices (e.g., the transistor 100) having improved threshold voltage and improved device reliability.

The device (e.g., the transistor 100) fabricated according to the method 200 may undergo further processing to form various features and regions known in the art. For example, subsequent processing may form various contacts/vias/lines and multilayers interconnect features (e.g., metal layers and interlayer dielectrics) on the substrate including the device, configured to connect the various features to form a functional circuit that may include one or more devices (e.g., one or more transistors 100). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Figure 3B:
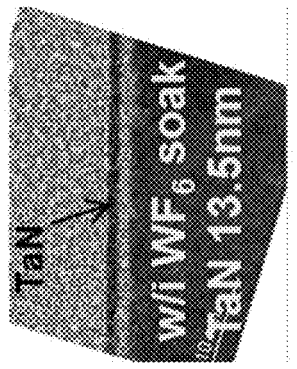
FIG. 3B illustrates an exemplary cross-sectional TEM image for a second device processed using a pre-treatment process, in accordance with some embodiments.
Figure 3A:
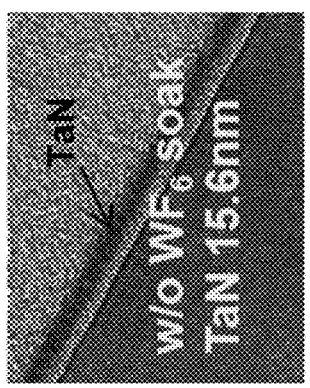
FIG. 3A illustrates an exemplary cross-sectional transmission electron microscope (TEM) image for a first device processed without performing a pre-treatment process, in accordance with some embodiments.
Figure 3C:
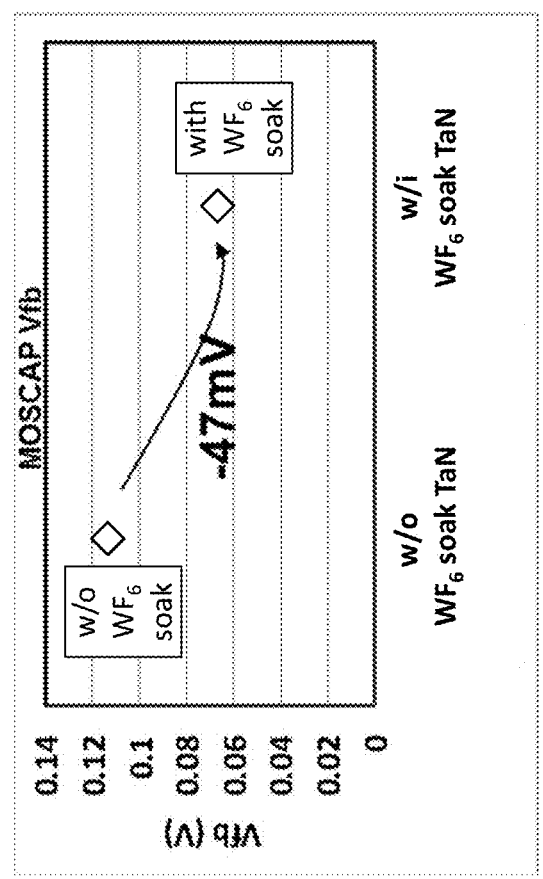
FIG. 3C illustrates a graph showing flatband voltage (Vfb) as a function of various processing conditions, in accordance with some embodiments.

Referring now to FIGS. 3A-3C, illustrated therein are cross-sectional transmission electron microscope (TEM) images for a device processed without performing a pre-treatment process (FIG. 3A), and for a device processed using a pre-treatment process (FIG. 3B), as well as a graph (FIG. 3C) showing flatband voltage (Vfb) as a function of various processing conditions, and further illustrating the benefit to device threshold voltage (Vt) for devices processed according to embodiments of the present disclosure. It is noted that the TEM images of FIGS. 3A and 3B illustrate exemplary compositions for the stack-up of layers (e.g., for a metal gate stack). These exemplary compositions are provided merely for ease of reference and not intended to be limiting beyond what is specifically claimed. Various compositions within the scope of the present disclosure may include (e.g., within a single gate stack) one or more work-function layers, one or more barrier layers, one or more capping layers, one or more metal fill layers, one or more polysilicon layers, one or more silicide layers, one or more doped layers, or other appropriate layers, including and/or beyond those layers that are specifically mentioned herein, and which may be configured as necessary or desired for a given technology or application. Additionally, in some embodiments, the pre-treatment process and subsequent metal layer deposition processes described herein may be repeated multiple times for a given gate stack. In some examples, the pre-treatment process may be repeated multiple times to treat a particular metal layer (e.g., a particular work-function metal layer) prior to deposition of a subsequent metal layer.

For clarity of discussion, it is noted that transistor threshold voltage (Vt) and flatband voltage (Vfb) may be generally expressed as:

$$V_t = V_{fb} + \frac{\sqrt{2q\epsilon N_A 2\varphi_B}}{C_{ox}}$$

$$V_{fb} = \varphi_{ms} + 2\varphi_B - \frac{Q_f}{C_{ox}}$$

From these two expressions for Vt and Vfb, it is clear that Vt is affected by changes in the flatband voltage, and the flatband voltage is dependent on the work function $\phi_{ms}$.

Referring first to FIG. 3A, illustrated therein is an exemplary structure including a TaN layer, where the TaN layer may be the work-function layer described above. In some embodiments, a TiAlC layer may be deposited over the TaN layer. In various examples, the TaN layer and the TiAlC layer may be part of the gate electrode 108 or the metal layer 164 described above with reference to FIG. 1A and FIG. 1B, respectively. As shown, and in some embodiments, the TaN layer may have a thickness of about 15.6 nm. It is noted that for the exemplary structure of FIG. 3A a pre-treatment process as described herein has not been performed. Thus, for example, after deposition of the TaN layer, a next metal layer (e.g., such as a TiAlC layer) may be directly deposited over the TaN layer without performing a pre-treatment process. It is noted, as described above, that a work function value of the TaN layer is dependent on the thickness of the TaN layer. Thus, a value of the work function for the exemplary structure of FIG. 3A will be based at least in part on the thickness of the TaN layer, which in turn will at least in part determine the flatband voltage (Vfb), which in turn will at least in part determine a threshold voltage for a device include the exemplary structure of FIG. 3A. As shown in FIG. 3C, a resulting device fabricated having the exemplary structure of FIG. 3A is measured to have a flatband voltage (Vfb) equal to about 115 mV.

Referring next to FIG. 3B, illustrated therein is an exemplary structure including a TaN layer, similar to FIG. 3A. In some embodiments, a TiAlC layer may be deposited over the TaN layer. In various examples, the TaN layer and the TiAlC layer may be part of the gate electrode 108 or the metal layer 164 described above with reference to FIG. 1A and FIG. 1B, respectively. In contrast to the example of FIG. 3A, for the exemplary structure of FIG. 3B a pre-treatment process, as described herein, is performed to treat the TaN layer (e.g., the work-function layer) of a high-K (HK)/metal gate (MG) stack prior to deposition of a subsequent metal layer. In various embodiments, the pre-treatment process performed to treat the TaN layer may include an ex situ or in-situ pre-treatment process. In the example of FIG. 3B, the pre-treatment process applied to the TaN layer may include a $WF_6$ soak or pre-treatment ($WF_6$ is the precursor). In at least some examples, the $WF_6$ soak or pre-treatment may be performed at a temperature of about 300° C., and for a duration of about 30 seconds. By way of example, the pre-treatment process used for the example of FIG. 3B may be performed via a plasma generated using $WF_6$ or via a thermal chemical reaction employing $WF_6$ precursor. However, as described above, other fluorine [F]-based precursors may be used (whether as a plasma or via a thermal chemical reaction) to perform the pre-treatment process described herein. For example, in some embodiments, the F-based precursor may include $NF_x$, $TiF_x$, or $WF_x$, where 'x' is equal to about 1-6. As a result of the pre-treatment process, a portion of the TaN layer (which may have been previously oxidized) may be removed, such that a thickness of the TaN layer is reduced (e.g., to about 13.5 nm). In some embodiments, merely for illustrative purposes, the thickness reduction described herein may be from about 13-15%. In some embodiments, a subsequent metal layer (e.g., a TiAlC layer) may be deposited (e.g., by ALD) sequentially, and in some cases in situ, after performing the pre-treatment of the TaN layer. In some embodiments, the deposited TiAlC layer in the example of FIG. 3B may thus be thicker than for the example of FIG. 3A, which did not include the pre-treatment process. Moreover, in various embodiments, a number of growth ALD growth cycles for the TiAlC layer for both of the exemplary structures of FIGS. 3A and 3B may be substantially the same. As noted above, the work function value of the TaN layer is dependent on the thickness of the TaN layer. Thus, a value of the work function for the exemplary structure of FIG. 3B will be different than the work function value for the exemplary structure of FIG. 3A, based at least in part on the reduced thickness of the TaN layer, which in turn will affect the flatband voltage (Vfb) and the threshold voltage for a device including the exemplary structure of FIG. 3B. Generally, in some embodiments, performing the pre-treatment process as described herein may result in the reduction of the thickness of the work function layer (e.g., the TaN layer) and may change the value of the work function of the work-function layer, and thereby change (improve) the value of the threshold voltage (Vt). As shown in FIG. 3C, a resulting device fabricated having the exemplary structure of FIG. 3B, and which included the pre-treatment process, is measured to have a flatband voltage (Vfb) equal to about 68 mV. Thus, the $WF_6$ soak/pre-treatment performed for the exemplary structure of FIG. 3B results in about a −47 mV Vfb shift (Vfb improvement) as compared to the exemplary structure of FIG. 3A, which did not undergo the pre-treatment process. Stated another way, the $WF_6$ soak/pre-treatment for the exemplary structure of FIG. 3B results in about a ~47 mV band-edge shift for the TaN layer. In some embodiments, "band-edge shift" may be used to describe the conduction band edge shift (e.g. for NMOS transistors) or valence band edge shift (e.g., for PMOS transistors), such that the pre-treatment process can be said to have tuned the work-function of the work-function layer (e.g., the TaN layer).

With reference now to FIG. 4A, illustrated therein is an exemplary structure 402 including a high-K layer ($HfO_2$), a TiN layer over the high-K layer, a TaN layer over the TiN layer, a layer 404 (which may include the next metal layer described above, such as a TiAlC layer) over the TaN layer, and a TiN layer over the layer 404. In various examples, the TiN layer over the high-K layer, the TaN layer over the TiN layer, the layer 404 (e.g., the TiAlC layer) over the TaN layer, and the TiN layer over the layer 404 may be part of the gate electrode 108 or the metal layer 164 described above with reference to FIG. 1A and FIG. 1B, respectively. In at least some embodiments, the TaN layer is a barrier layer. It is noted that FIG. 4A illustrates an exemplary compositions for the stack-up of layers (e.g., for a metal gate stack). This exemplary composition is provided merely for ease of reference and is not intended to be limiting beyond what is specifically claimed. Various compositions within the scope of the present disclosure may include (e.g., within a single gate stack) one or more work-function layers, one or more barrier layers, one or more capping layers, one or more metal fill layers, one or more polysilicon layers, one or more silicide layers, one or more doped layers, or other appropriate layers, including and/or beyond those layers that are specifically mentioned herein, and which may be configured as necessary or desired for a given technology or application. In some embodiments, the TaN layer may be the work-function layer described above. Additionally, arrows 408 may be used to indicate that the pre-treatment process is performed on the TaN layer prior to deposition of the layer 404. In various embodiments, the pre-treatment process (e.g., of the TaN layer) may include an ex situ or in situ pre-treatment process. In some cases, the arrows 408 may be used to indicate a surface condition (e.g., pre-treated) of an adjacent (e.g., underlying) layer.

Figure 4B:
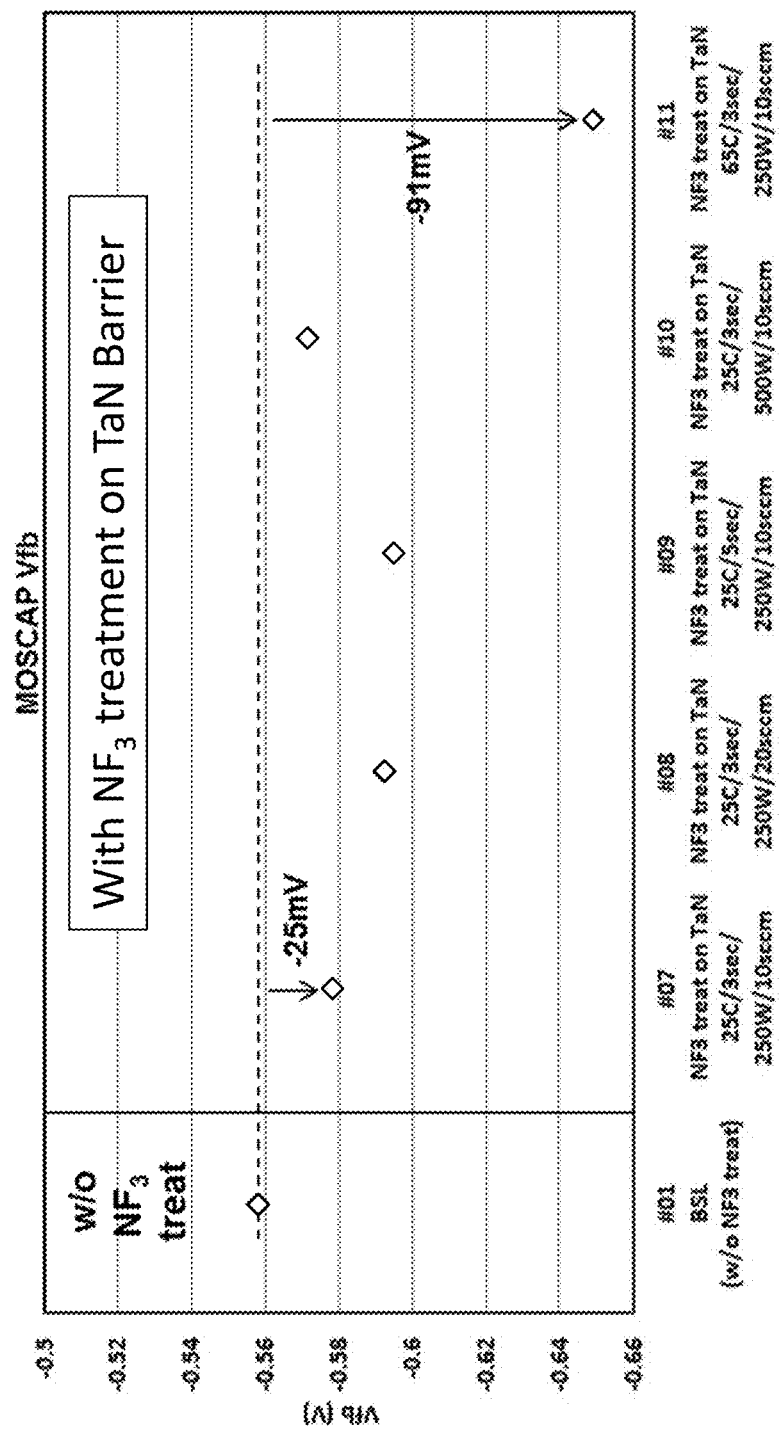
FIG. 4B illustrates is a graph showing Vfb as a function of various pre-treatment processing conditions for the exemplary structure of FIG. 4A.

Referring to FIG. 4B, illustrated therein is a graph showing flatband voltage (Vfb) as a function of various pre-treatment processing conditions for the exemplary structure 402 of FIG. 4A, and further illustrating the benefit to device threshold voltage (Vt) for devices processed according to embodiments of the present disclosure. For the example of FIGS. 4A/4B, the pre-treatment process used may be performed via a remote plasma using an $NF_3$ precursor to generate $NF_3$ radicals, which are effective to clean/treat a metal layer (e.g., to clean an oxide layer from a surface of a work-function metal such as TaN). The pre-treatment process, with reference to FIGS. 4A/4B, is performed to treat the TaN layer (e.g., the work-function layer) of a high-K (HK)/metal gate (MG) stack prior to deposition of a subsequent metal layer (e.g., the layer 404).

Beginning with a baseline (BSL) sample #01, for which a pre-treatment process is not performed, a resulting MOS capacitor (MOSCAP) is measured to have a flatband voltage (Vfb) equal to about −560 mV. It is noted that a remote plasma using $NF_3$ radicals was used to pre-treat the TaN layer for samples #07, #08, #09, #10, and #11, prior to deposition of a subsequent metal layer. It is also noted that the efficacy of the pre-treatment process of the present example (including Vfb shift and associated Vt improvement) depends on a processing temperature, a pre-treatment time (duration), a pre-treatment power (e.g., of the plasma power supply), and a precursor (e.g., $NF_3$) flow rate. For example, referring first to sample (#07), an $NF_3$ remote plasma pre-treatment process of the TaN layer is performed at 25° C., for 3 seconds, at 250 W, and at a precursor flow rate of 10 sccm, and a resulting MOSCAP is measured to have a flatband voltage (Vfb) equal to about −580 mV, or ~20-25 mV improved as compared to the BSL sample #01. Referring next to sample (#08), an $NF_3$ remote plasma pre-treatment process of the TaN layer is performed at 25° C., for 3 seconds, at 250 W, and at a precursor flow rate of 20 sccm, and a resulting MOSCAP is measured to have a flatband voltage (Vfb) equal to about −590 mV, or ~30 mV improved as compared to the BSL sample #01. Referring to sample (#09), an $NF_3$ remote plasma pre-treatment process of the TaN layer is performed at 25° C., for 5 seconds, at 250 W, and at a precursor flow rate of 10 sccm, and a resulting MOSCAP is measured to have a flatband voltage (Vfb) equal to about −595 mV, or ~35 mV improved as compared to the BSL sample #01. Referring next to sample (#10), an $NF_3$ remote plasma pre-treatment process of the TaN layer is performed at 25° C., for 3 seconds, at 500 W, and at a precursor flow rate of 10 sccm, and a resulting MOSCAP is measured to have a flatband voltage (Vfb) equal to about −570 mV, or ~10 mV improved as compared to the BSL sample #01. Referring to sample (#11), an $NF_3$ remote plasma pre-treatment process of the TaN layer is performed at 65° C., for 3 seconds, at 250 W, and at a precursor flow rate of 10 sccm, and a resulting MOSCAP is measured to have a flatband voltage (Vfb) equal to about −651 mV, or ~91 mV improved as compared to the BSL sample #01. In general, as illustrated by the results of FIG. 4B, an increase of $NF_3$ radicals (e.g., by increasing the pre-treatment time from 3 seconds to 5 seconds, by increasing the precursor flow rate from 10 sccm to 20 sccm, or by increasing the processing temperature from 25° C. to 65° C.) results in more improvement of the flatband voltage (Vfb). Stated another way, an increase of $NF_3$ radicals is found to shift Vfb more toward the band-edge (e.g., toward a conduction band for N-type transistors or toward a valence band for P-type transistors). Thus, the $NF_3$ remote plasma pre-treatment process of the TaN layer can be said to have tuned the work-function of the work-function layer (e.g., the TaN layer).

Referring now to FIG. 5, illustrated therein is a schematic top-view diagram of an exemplary multi-chamber processing system 500. In some embodiments, the system 500 may be equivalently referred to as a "cluster tool". The system 500 may generally include load lock chambers 502, 504, a wafer handling chamber 506, and a plurality of processing chambers 1-6. In various embodiments, the load lock chambers 502, 504 provide for the transfer of substrates into and out of the system 500. In various embodiments, the system 500 is under vacuum, and the load lock chambers 502, 504 may "pump down" the substrates introduced into the system 500 (e.g., by way of a mechanical pump and/or a turbomolecular pump). In some embodiments, the load lock chambers 502, 504 may be adapted to receive a single wafer or a plurality of wafers (e.g., loaded into a cassette). By way of example, the load lock chambers 502, 504 may be separated from the wafer handling chamber 506 by way of a gate valve, allowing the wafer handling chamber 506 to remain under vacuum when one or both of the load lock chambers 502, 504 are vented.

In various embodiments, the wafer handling chamber 506 is equipped with an automated, robotic arm that may move smoothly along any of a horizontal, vertical, and/or rotational axis so as to transfer substrates between the load lock chambers 502, 504 and any of the substrate processing chambers 1-6. Each processing chamber 1-6 may be configured to perform a number of substrate processing operations such as atomic layer deposition (ALD), CVD, PVD, etching, pre-treatment/pre-soak, de-gassing, annealing, as well as a number of metrology operations such as XPS analysis, AFM analysis, and/or other suitable processing or metrology operations. In various embodiments, the system 500 may have more or less processing chambers, for example, as necessary for a particular process to be performed by the system 500.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to a pre-deposition treatment (e.g., of a work-function layer) and subsequent atomic layer deposition (ALD) process (e.g., subsequent ALD metal layer deposition) over the pre-treated layer. In addition, embodiments of the present disclosure may be effectively employed to accomplish work function tuning, as described above. In various embodiments, the pre-deposition treatment process (pre-treatment process) includes cleaning an oxidized surface (e.g., of a work-function layer) by using a fluorine [F]-based precursor pre-soak or pre-treatment process. The pre-treatment process described herein may effectively mitigate metal surface loading effects (e.g., of the work-function layer), thereby resulting in an improved device threshold voltage (Vt). Thus, at least some advantages of the present disclosure include improving device Vt by using a [F]-based metal precursor pre-soak process to treat a work function setting layer (e.g., N-type work function layer), prior to deposition of an appropriate next metal layer (e.g. another work-function layer, barrier layer, cap layer, or other appropriate next metal layer), which may be performed together/ sequentially (e.g., in-situ) in a processing system such as a cluster tool (e.g., an ALD cluster tool where chambers are clustered together). Embodiments of the present disclosure may also be simultaneously used to ameliorate gap fill impact (e.g., by use of ALD processing), as described above. To be sure, in some embodiments, a separate ex-situ pre-treatment (e.g., of the work-function layer) followed by deposition of the next metal layer may provide some advantages as well (e.g., threshold voltage improvement).

Thus, one of the embodiments of the present disclosure described a method for fabricating a semiconductor device, where the method includes forming a gate dielectric layer over a substrate and depositing a work-function metal layer over the gate dielectric layer. Thereafter, a fluorine-based treatment of the work-function metal layer is performed, where the fluorine-based treatment removes an oxidized layer from a top surface of the work-function metal layer to form a treated work-function metal layer. In some embodiments, after performing the fluorine-based treatment, another metal layer is deposited over the treated work-function metal layer.

In another of the embodiments, discussed is a method where a gate dielectric layer is formed over a substrate, a barrier layer is formed over the gate dielectric, a plasma is generated using a fluorine-based precursor and the barrier layer is exposed to the plasma. In various embodiments, responsive to exposing the barrier layer to the plasma, an oxide layer is removed from a surface of the barrier layer. In some examples, after removing the oxide layer, another metal layer is deposited over the barrier layer.

In yet another of the embodiments, discussed is a device including a substrate having a gate stack formed thereon. By way of example, the device further includes a gate dielectric layer disposed over the substrate, a pre-treated work-function metal layer disposed over the gate dielectric layer, and a subsequent metal layer disposed over the pre-treated work-function metal layer. In various embodiments, the pre-treated work-function metal layer includes a F-based metal precursor plasma treated work-function metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
    forming a gate dielectric layer over a substrate;
    depositing a work-function metal layer over the gate dielectric layer;
    performing a fluorine-based treatment of the work-function metal layer, wherein the fluorine-based treatment removes an oxidized layer from a top surface of the work-function metal layer to form a treated work-function metal layer; and
    after performing the fluorine-based treatment, depositing another metal layer over the treated work-function metal layer.

2. The method of claim 1, wherein the performing the fluorine-based treatment and the depositing another metal layer are performed in-situ, while maintaining the substrate under a vacuum condition.

3. The method of claim 1, wherein the fluorine-based treatment includes a precursor including at least one of $NF_x$, $TiF_x$, and $WF_x$, wherein x is between approximately 1 and approximately 6.

4. The method of claim 1, wherein the work-function metal layer includes at least one of TiN, TaN, TiAlC, TiAl, TiSiN, TaSi, and TiAlN.

5. The method of claim 1, wherein the work-function metal is deposited at a temperature from approximately 200 degrees Celsius to approximately 600 degrees Celsius.

6. The method of claim 1, wherein the fluorine-based treatment includes a thermal chemical reaction between a F-based metal precursor and the oxidized layer of the work-function metal layer, and wherein the thermal chemical reaction serves to remove the oxidized layer.

7. The method of claim 6, wherein the thermal chemical reaction is performed at a temperature from about 100-1000° C., and wherein a F-based metal precursor flow rate is about 100-8000 sccm.

8. The method of claim 1, wherein the fluorine-based treatment includes a plasma treatment including a plasma generated using a F-based metal precursor, and wherein the oxidized layer of the work-function metal layer is removed by the plasma treatment.

9. The method of claim 8, wherein the plasma treatment is performed at a temperature from about 20-200° C., wherein a F-based metal precursor flow rate is about 5-500 sccm, and wherein a plasma power is about 10-1000 Watts.

10. The method of claim 8, wherein the F-based metal precursor includes an $NF_3$ metal precursor, wherein the plasma generates $NF_3$ radicals, and wherein the $NF_3$ radicals remove the oxidized layer of the work-function metal layer.

11. The method of claim 10, wherein a number of $NF_3$ radicals are increased by increasing at least one of a duration of the fluorine-based treatment, a precursor flow rate, and a processing temperature.

12. The method of claim 1, wherein the fluorine-based treatment reduces a thickness of the work-function metal layer.

13. A method of semiconductor device fabrication, comprising:
    forming a gate dielectric layer over a substrate;
    forming a barrier layer over the gate dielectric;
    generating a plasma using a fluorine-based precursor and exposing the barrier layer to the plasma;
    responsive to exposing the barrier layer to the plasma, removing an oxide layer from a surface of the barrier layer; and
    after removing the oxide layer, depositing another metal layer over the barrier layer.

14. The method of claim 13, wherein the barrier layer includes a work-function metal layer.

15. The method of claim 13, wherein the barrier layer includes TaN.

16. The method of claim 13, wherein the another metal layer a TiAlC layer.

17. The method of claim 16, further comprising depositing a TiN layer over the TiAlC layer.

18. The method of claim 13, wherein plasma includes a remote plasma, wherein the fluorine-based precursor includes $NF_3$, wherein the remote plasma generates $NF_3$ radicals, and wherein the barrier layer is exposed to the generated $NF_3$ radicals, thereby removing the oxide layer.

19. A method, comprising:
    depositing, under a vacuum condition, a work-function metal layer over a gate dielectric layer;
    while maintaining the vacuum condition, performing a fluorine-based treatment of the work-function metal layer, wherein the fluorine-based treatment includes at least one of $NF_x$, $TiF_x$, and $WF_x$, and wherein the fluorine-based treatment removes an oxidized layer from a top surface of the work-function metal layer to form a treated work-function metal layer; and
    while maintaining the vacuum condition and after performing the fluorine-based treatment, depositing a TiAlC layer over the treated work-function metal layer.

20. The method of claim 19, wherein x is between approximately 1 and approximately 6.

* * * * *